United States Patent
Choe

(10) Patent No.: US 6,271,108 B1
(45) Date of Patent: Aug. 7, 2001

(54) METHOD OF FORMING A CONTACT IN SEMICONDUCTOR DEVICE

(75) Inventor: Jeong-Dong Choe, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/313,258

(22) Filed: May 18, 1999

(30) Foreign Application Priority Data

Dec. 18, 1998 (KR) .................................................. 98-56096

(51) Int. Cl.$^7$ ..................................................... H01L 21/44
(52) U.S. Cl. ........................... 438/597; 438/629; 438/637
(58) Field of Search ..................................... 438/597, 634, 438/629, 637, 672, 675, 424, 227, 225; 257/773, 774, 510, 511, 512, 513, 514, 515

(56) References Cited

U.S. PATENT DOCUMENTS

| | | | |
|---|---|---|---|
| 4,391,650 | * | 7/1983 | Pfeifer et al. ........................... 148/1.5 |
| 4,459,740 | * | 7/1984 | Schwabe et al. ................... 29/576 B |
| 4,535,532 | * | 8/1985 | Lancaster ............................. 29/576 B |
| 4,706,378 | * | 11/1987 | Havemann ............................ 438/363 |
| 4,793,897 | * | 12/1988 | Dunfeld et al. ....................... 156/643 |
| 4,902,634 | * | 2/1990 | Picco ..................................... 438/227 |
| 5,043,298 | * | 8/1991 | Yamada et al. ....................... 438/253 |
| 5,118,639 | * | 6/1992 | Roth et al. ............................ 438/300 |
| 5,132,241 | * | 7/1992 | Su ......................................... 438/228 |
| 5,264,387 | * | 11/1993 | Beyer et al. .......................... 438/404 |
| 5,401,680 | * | 3/1995 | Abt et al. .................................. 438/3 |
| 5,543,644 | * | 8/1996 | Abt et al. .............................. 257/295 |
| 5,550,076 | * | 8/1996 | Chen ..................................... 438/253 |
| 5,600,065 | * | 2/1997 | Kar et al. ........................... 73/504.12 |
| 5,654,589 | * | 8/1997 | Huang et al. ......................... 257/763 |
| 5,677,231 | | 10/1997 | Maniar et al. . |
| 5,759,867 | * | 6/1998 | Armacost et al. .................... 438/639 |
| 5,858,868 | * | 1/1999 | Hirade .................................. 438/597 |
| 5,880,006 | * | 3/1999 | Lin et al. .............................. 438/424 |
| 5,902,702 | * | 5/1999 | Nakao et al. ............................. 430/5 |
| 5,923,982 | * | 7/1999 | Kadosh et al. ....................... 438/286 |
| 5,968,846 | * | 10/1999 | Chou et al. ........................... 438/712 |
| 5,994,756 | * | 11/1999 | Umezawa et al. ................... 257/510 |
| 6,010,968 | * | 1/2000 | Yang et al. ........................... 438/719 |
| 6,018,180 | * | 1/2000 | Cheek et al. ......................... 257/344 |
| 6,020,272 | * | 2/2000 | Fleming ............................... 438/734 |
| 6,046,103 | * | 4/2000 | Thei et al. ............................ 438/624 |

FOREIGN PATENT DOCUMENTS

0283306 * 9/1988 (EP) ............................. H01L/21/31

* cited by examiner

Primary Examiner—Olik Chaudhuri
Assistant Examiner—Nathan W. Ha

(57) ABSTRACT

The present invention relates to a method of forming a contact in semiconductor device, more particularly, to a method of forming a borderless contact in semiconductor device which minimizes loss of field oxide on forming a contact hole, reducing leakage current at an interface between an active area and a field area and preventing another loss of silicon and silicide in the active area by forming a barrier layer on a field oxide layer for separating devices in order to enhance a process margin of forming the contact hole in the active area due to a reduced design rule and an increased device integrity. The present invention includes the steps of forming a trench on a semiconductor substrate wherein the trench defines an active area and a field area, filling up the trench with an insulating layer, forming a barrier layer just on the insulating layer, forming a transistor in the active layer wherein the transistor has an impurity diffusion region, forming an insulating interlayer on a surface of the substrate including the transistor and the barrier layer, and forming at least a contact hole by removing a predetermined portion of the insulating interlayer wherein the contact hole exposes both a portion of the impurity diffusion region and another portion of the barrier layer.

10 Claims, 5 Drawing Sheets

METHOD OF FORMING A CONTACT IN SEMICONDUCTOR DEVICE

BACKGROUND OF THE INVENTION

1. Field of Invention

Figure 1A:
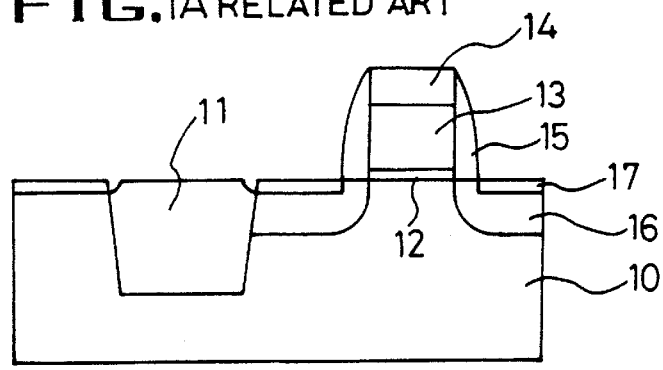

The present invention relates to a method of forming a contact in semiconductor device, and more particularly, to a method of forming a borderless contact in semiconductor device which minimizes loss of field oxide when forming a contact hole. This reduces leakage current at an interface between an active area and a field area and prevents further loss of silicon and silicide in the active area by forming a barrier layer on a field oxide layer in order to enhance a process margin of forming the contact hole in the active area due to a reduced design rule and an increased device integration.

2. Discussion of Related Art

In general, trench isolation is achieved by forming a trench between active areas to be separated and by filling the trench with oxide and the like for electrical isolation. Devices such as transistors are then formed in the active area or over the trench.

In a trench isolation method forming a borderless contact on a trench causes some problems. A borderless contact means that a contact is formed on a specific area through an active area and a field area on a semiconductor substrate. One of the problems is that it is hard to keep a trench isolation area intact when forming a contact hole by etching an insulating interlayer.

When forming an ordinary contact hole, there is no field oxide loss from forming a direct contact if a space between a gate and a field oxide is sufficient for the size of the contact hole. In this case, the contact hole lies just on the active area without a portion overlapped with the field oxide.

Actually, when an active layer consists of a silicon junction or salicide such as Co, Ti or the like, there is no field oxide loss because a border between the active area and the field oxide layer is free by an attack from an etchant used to form a contact hole. Thus, no leakage current occurs in the border.

If an active area between a field area and a gate line is smaller than the size of a contact hole, or if the contact hole lies overlaps both a field oxide layer and the active layer, a loss of field oxide overlapped with the contact hole is caused by an overetch in etching an insulating interlayer. In this case, leakage current as well as cell separation failure is brought about by damage to an exposed substrate caused by plasma. Accordingly, a nitride layer for protecting the field oxide layer is deposited on the field oxide layer after a gate line has been formed or a salicide layer has been formed on the active area.

An ordinary contact does not requires an etch-stopping layer from forming a contact hole, but a borderless contact requires an additional nitride layer. Thus, a process of forming a borderless contact needs an extra step of etching the additional nitride layer. In this case, it is essential for a nitride layer etch to employ a high etch selectivity between silicon and salicide(or silicide).

U.S. Pat. No. 5,677,231 (Oct. 14, 1997), U.S. Pat. No. 5,654,589 (Aug. 5, 1997), U.S. Pat. No. 5,759,867 (Jun. 2, 1998) show methods of etching etch-stop layers or a methods of forming a protective layer over a field oxide layer. They show a method of carrying out a secondary etch after first dry etching an oxide layer when forming a contact hole, and a method of carrying out chemical-mechanical polishing of an extra layer for protecting silicon in an active area before filling up a trench.

FIG. 1A to FIG. 1E are cross-sectional views illustrating formation of a contact in a semiconductor device according to the related art.

Referring to FIG. 1A, an oxide layer 11 in a trench is formed after a predetermined portion of a silicon semiconductor substrate 10 of is removed by photolithography to form the trench. In this case, the trench is filled by depositing silicon oxide on the silicon substrate 10 including the trench and then, etching back etching back the silicon oxide. However, a shallow groove is formed on an upper edge of the oxide layer 11 in the trench due to a physical characteristic of an overetch.

A polycrystalline silicon layer doped with impurity ions is formed to form a gate, after forming an oxide layer on the exposed substrate 10. A silicon nitride layer for forming a capping insulating layer 14 on the polycrystalline layer.

A gate pattern 12–14 is defined by patterning the silicon nitride layer the polycrystalline silicon layer the gate oxide layer using a dry etch thereby obtaining gate oxide layer 12, gate 13, and capping insulating layer 14. A sidewall spacer 15 of silicon oxide is formed by etching back a silicon oxide layer having been deposited on the whole substrate 10. Including the gate pattern, an lightly doped buried layer for a lightly doped drain(hereinafter abbreviated LDD) junction, not shown in the drawing, is formed around a lower edge of the gate 13 on the substrate 10 by lightly doping the substrate with impurity ions lightly.

After the forming the sidewall spacer 15, a source/drain junction 16 is formed by a heavy ion implantation. A salicide layer 17 for reducing electrical resistance is formed on the exposed source/drain junction 16 to complete a MOS transistor.

Figure 1B:
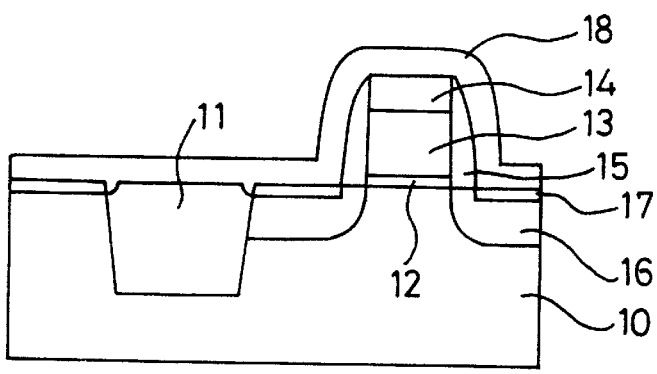

Referring to FIG. 1B, a nitride layer 18 is formed on a whole surface of the substrate 10 including the salicide layer 17, the transistor, and the field oxide layer 11. The nitride layer 18 has a very high etch selectivity relative to oxide, silicon, and salicide when forming a borderless contact. Thus, the nitride layer becomes a barrier layer in forming a contact hole in two steps.

Figure 1C:
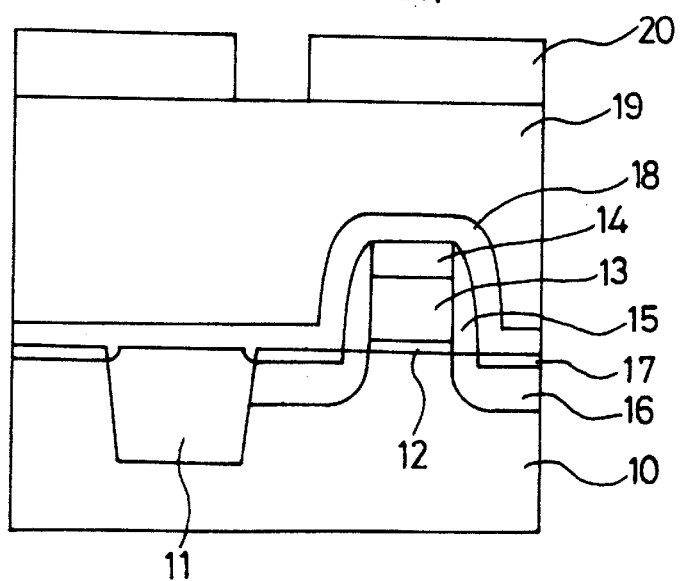

Referring to FIG. 1C, an insulating oxide interlayer 19 for protection and planarization is thickly formed on the nitride layer 18. The insulating interlayer 19 is coated with photoresist. A photoresist pattern 20 is then formed exposing a portion of the insulating interlayer 19 over a borderless contact to defined a borderless contact area.

Figure 1D:
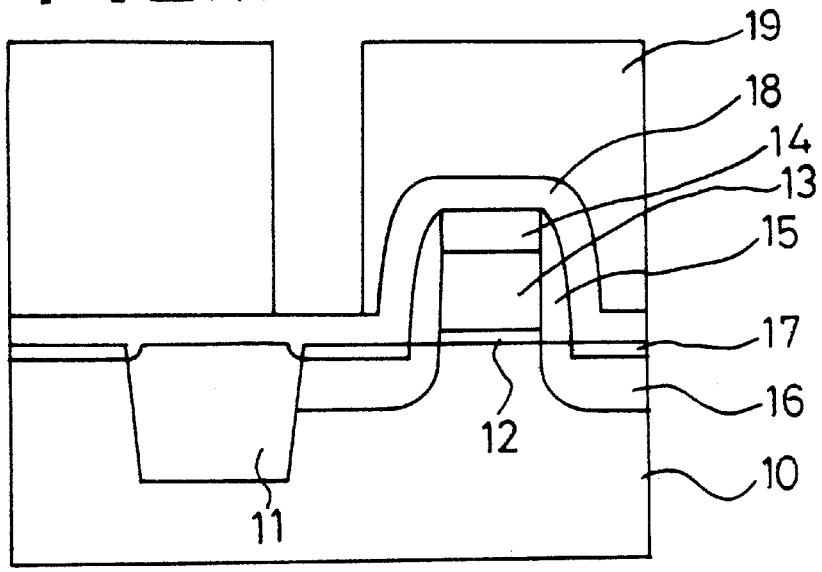
Figure 1E:
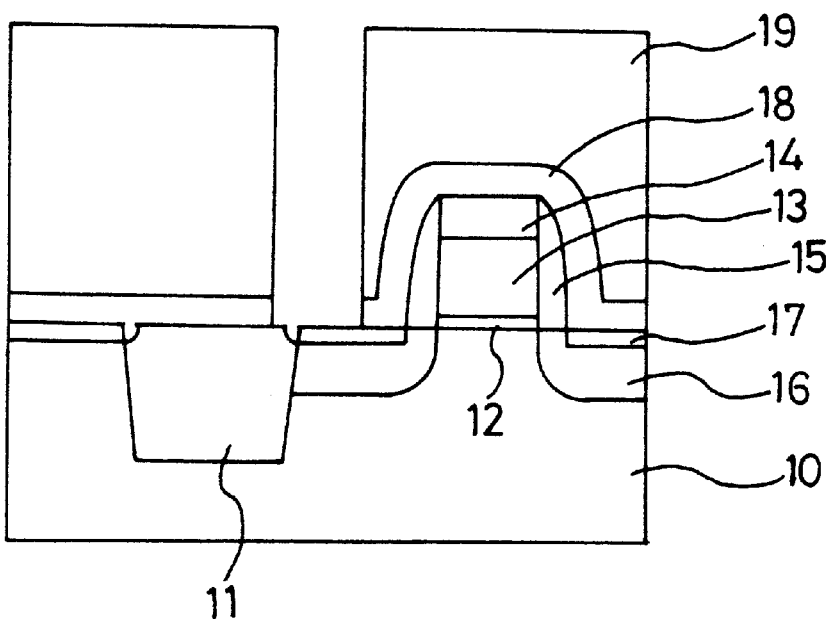

Referring to FIG. 1D, a portion of the nitride layer 18 is exposed by dry etching a portion of the insulating interlayer 19 not covered with the photoresist pattern 20. The dry etch is carried out using a $C_2F_6$ etchant, using the photoresist pattern 20 as an etch mask. The photoresist pattern is then removed. Referring to FIG. 1E, a contact hole exposing both the salicide layer 17 and the field oxide layer 11 is formed by dry etching an exposed portion of the nitride layer 18. In this case, $C_2F_6$ and $O_2$ are used as etchants. The resulting contact hole is a so-called borderless contact hole because the contact hole is formed through the field oxide layer and the salicide layer 17.

Unfortunately, the method of forming a contact in semiconductor device according to the related art suffer from, for example, failure of cell isolation and the loss of salicide and field oxide layers of which portions are etched away in etching a nitride layer. Therefore, leakage current is caused by the damaged silicon overetched by plasma.

SUMMARY OF THE INVENTION

Accordingly, the present invention is directed to a method of forming a contact in semiconductor device that substantially obviates one or more of the problems occurring in related art devices.

A method of forming a contact in semiconductor device, according to the present invention minimizes damage to a silicon substrate by forming a barrier layer before forming a contact hole. Therefore, it is easy to control a critical dimension of the contact hole by etching oxide and nitride layers independently. Also, leakage current and contact resistance are reduced by filling up a groove on an upper edge of a field oxide layer. Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes forming a trench on a semiconductor substrate to define an active area and a field area, filling up the trench with an insulating layer, forming a barrier layer just on the insulating layer, forming a transistor in the active layer wherein the transistor has an impurity diffusion region, forming an insulating interlayer on a surface of the substrate including the transistor and the barrier layer, and forming at least one contact hole by removing a predetermined portion of the insulating interlayer so that the contact hole exposes both a portion of the impurity diffusion region and another portion of the barrier layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIG. 1A to FIG. 1E are cross-sectional views of forming a contact in semiconductor device according to the related art; and FIG. 2A to FIG. 2F are cross-sectional views of forming a contact in semiconductor device according to the present invention.

DETAILED DESCRIPTION OF PREFERRED EMBODIMENTS

Reference will now be made in detail to the preferred embodiment of the present invention, an example of which is illustrated in the accompanying drawings.

The present invention includes forming and patterning a barrier layer on a field oxide layer for device isolation. The barrier layer is patterned with a mask which has a reversed pattern used to define a field area and an active area. After the barrier layer is patterned by etching, silicon in the active layer is exposed and the barrier layer of silicon nitride or Si—N—O remains on the field oxide layer.

When a contact hole is formed by removing a portion of an insulating interlayer having been deposited on the substrate, the secondary etching of the nitride or Si—N—O as in the related art is not necessary after the removal of the insulating interlayer. The loss of the field oxide layer is prevented by the remaining barrier layer when forming the contact hole.

Accordingly, the present invention differs from the related art in that a secondary etch is not necessary to form the contact hole because the barrier layer just lies on the field oxide layer.

FIG. 2A to FIG. 2F are cross-sectional views of forming a contact in semiconductor device according to the present invention.

Figure 2A:
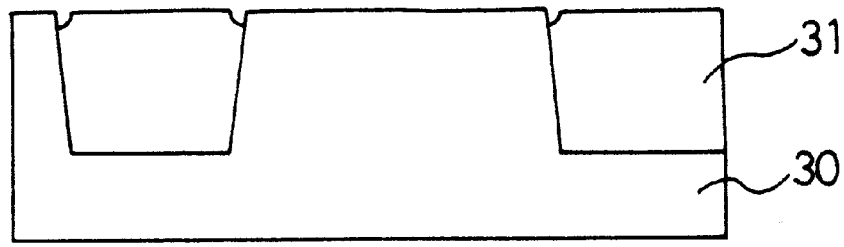

Referring to FIG. 2A, an oxide layer 31 is deposited in a trench defining an active area and a field area after a predetermined portion of a semiconductor substrate 30 of silicon is removed by photolithography. In this case, the trench is filled by depositing silicon oxide using chemical vapor deposition (hereinafter abbreviated CVD) on the silicon substrate 30 including in the trench, followed by etching back the silicon oxide using the surface of the substrate as an etch-stop layer. However, a shallow groove is formed on an upper edge of the filling oxide layer 31 due to a physical characteristic of an overetch.

Figure 2B:
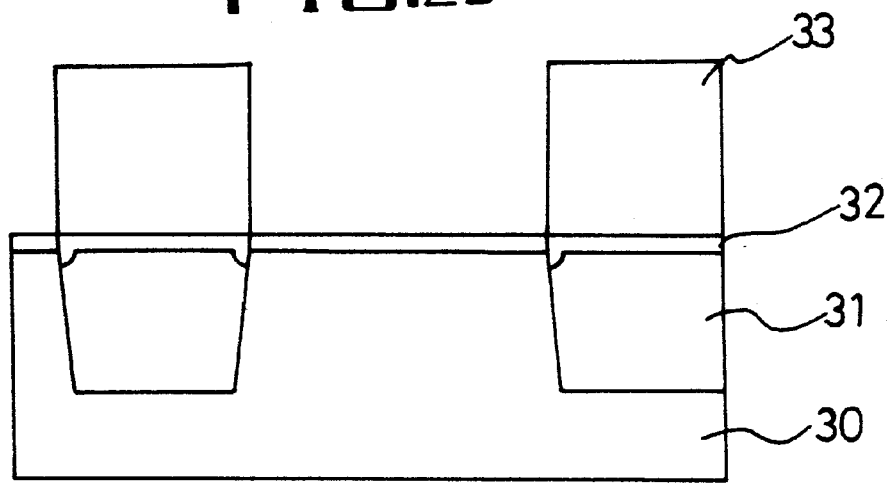

Referring to FIG. 2B, a silicon nitride layer acting as a barrier layer 32 is formed on the substrate 30 including a surface of the field oxide layer 31 formed in the trench. In this case, the depth of the nitride layer is sufficient to fill up a groove at the edge of oxide layer 31 so that the loss of material from the field oxide layer forming a contact hole and leakage current is prevented.

After the barrier layer 32 is coated with photoresist, layer a photoresist pattern 33 is formed by exposing and developing the photoresist layer using photo mask having a reverse pattern compared the mask used in defining the field and active areas. Accordingly, the photoresist pattern 33 exactly covers the barrier layer 32 on the field oxide layer 31.

Figure 2C:
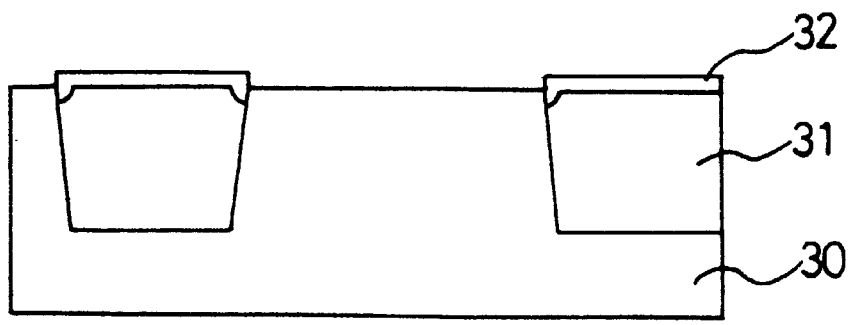

Referring to FIG. 2C, the active layer in the substrate 30 is exposed by removing a portion of the barrier layer 32 which is not covered with the photoresist pattern 33. This is carried out by a dry etching the barrier layer 32. The the photoresist pattern 33 is removed using oxygen plasma. Accordingly, the height of the remaining parts of barrier layer 32 is higher than that of the active layer of the substrate 30.

Figure 2D:
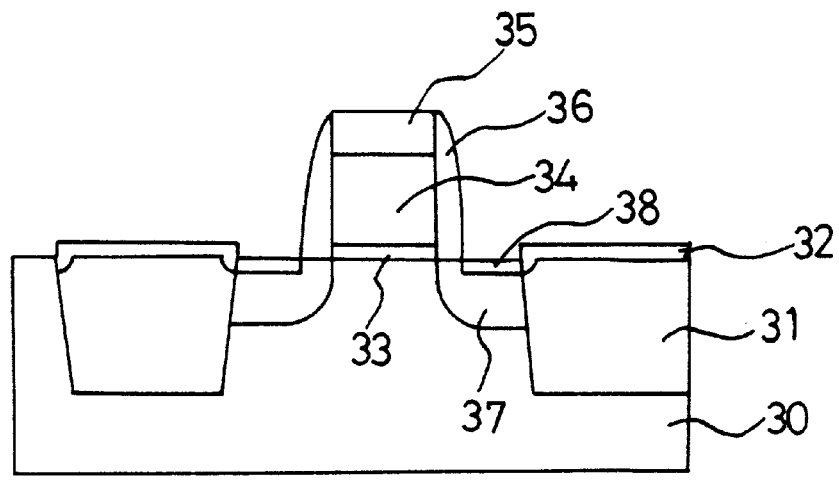

Referring to FIG. 2D, a polycrystalline silicon layer 34 doped with impurity ions is deposited on a gate insulating layer 33 of oxide formed on an exposed surface of the substrate 30. Then, a capping insulating layer 35 made of a silicon nitride is deposited on the polycrystalline silicon layer 34.

A gate pattern 33 to 35 is defined patterning the silicon nitride layer 35/the polycrystalline silicon layer 34/the gate oxide layer 33 using a dry etch. A sidewall spacer 36 of silicon oxide is formed by etching back a silicon oxide layer deposited on the whole substrate 30 including the gate pattern. An lightly doped buried impurity for an LDD junction, not shown in the drawing, is formed in around a lower edge of the gate 34 in the substrate by lightly doping the substrate with impurity ions.

After forming the sidewall spacer 36, a source/drain junction 37 is formed by heavily implanting ions. A salicide layer 38 for reducing electrical resistance is formed over the exposed source/drain junction 37 to complete a MOS transistor.

Figure 2E:
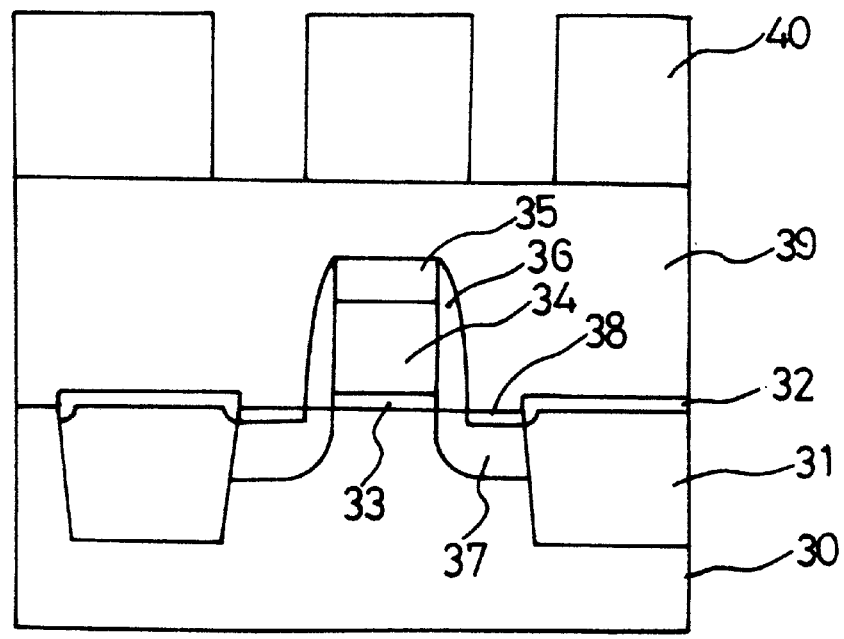

Referring to FIG. 2E, an insulating oxide interlayer 39 for protecting devices and planarizing the structure formed thickly on the whole surface of the substrate 30, including the barrier layer 32, the salicide layer 38, and the MOS transistor.

The insulating oxide interlayer 39 is coated with a layer. A. then, a photoresist pattern 40 exposing a portion of the insulating interlayer 39 over a borderless contact is formed by exposing and developing the photeresist layer with a photo mask which defining a borderless contact area.

Figure 2F:
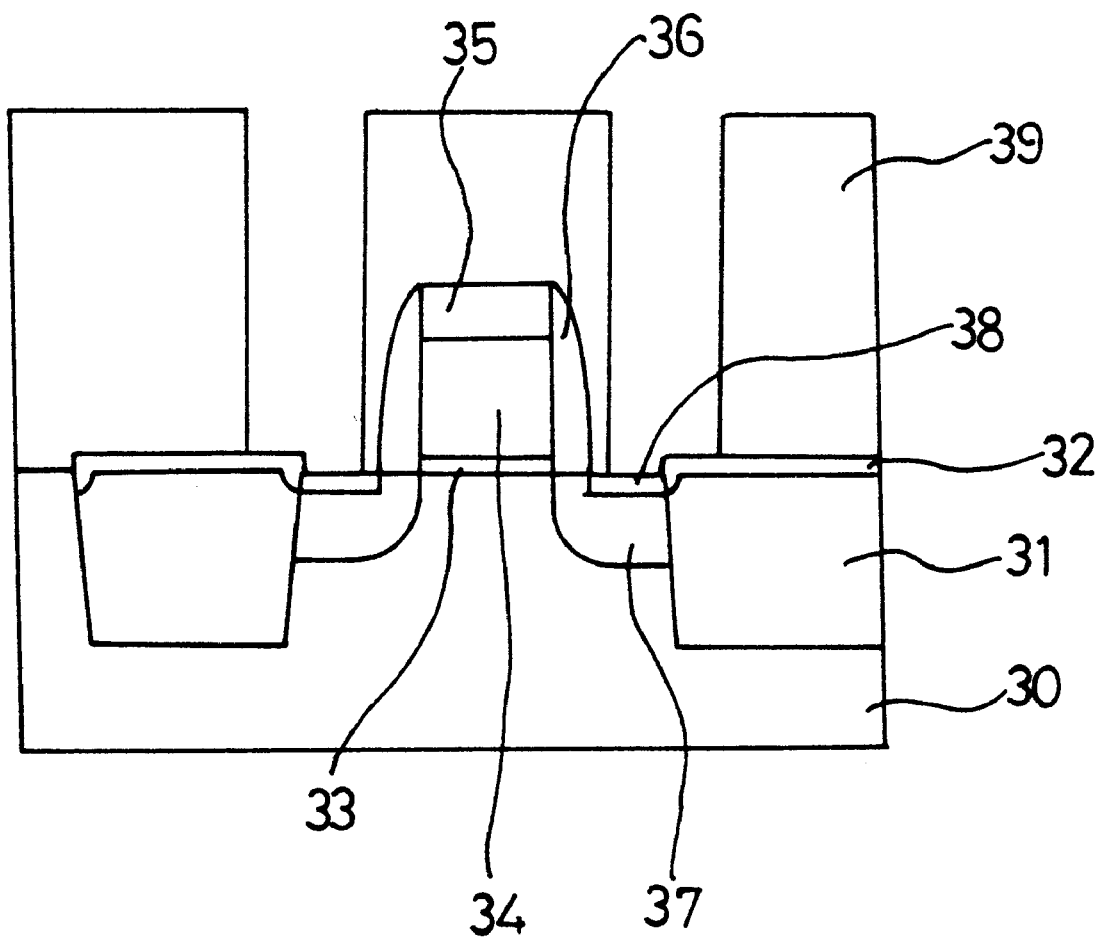

Referring to FIG. 2F, a portion of the a nitride layer 32 and the a portion of the salicide layer 38 are exposed by dry etching a portion of the insulating interlayer 39 which is not covered with the photoresist pattern, wherein the dry etch uses a $C_2F_6$ etchant of in and the photoresist pattern as an etch mask. In this case, the nitride barrier layer 32 prevents a portion of the field oxide layer 31 thereunder from being removed by the etchant. Then, the photoresist pattern is removed.

Not shown in the drawing, electrically conductive contacts plugs for forming electrical connections are formed in the contact holes wires are then formed on the plugs and the insulating interlayer 39.

A manufacturing process according to the present invention is simplified since an additional step of separately etching a barrier layer is not necessary, silicon loss is prevented, it is to control a CD of a contact hole and a thickness of a barrier layer is controlled and leakage current and contact resistance are improved by minimizing the loss of material from the field oxide and the substrate.

It will be apparent to those skilled in the art that various modifications and variations can be made in a method of forming a contact in semiconductor device of the present invention without departing from the spirit or scope of the inventions. Thus, it is intended that the present invention cover the modifications and variations of this invention provided they come within the scope of the appended claims and equivalents.

What is claimed is:

1. A method of forming a contact in a semiconductor device, comprising:

forming a field oxide layer in a trench in a semiconductor substrate to define an active area;

forming a barrier layer over the semiconductor substrate including the field oxide layer in the trench;

forming a barrier layer etch mask covering an area of the barrier layer corresponding to the field oxide layer; and etching the barrier layer using the barrier layer etch mask to leave portions of the barrier layer covering only the field oxide layer;

forming a transistor in the active area, the transistor including an impurity diffusion region in a portion of the substrate adjacent to the transistor;

covering the substrate, including the transistor, with an insulating interlayer; and forming a contact hole in the insulating interlayer including simultaneously exposing a portion of the impurity diffusion region and a portion of the barrier layer.

2. The method according to claim 1, wherein forming a field oxide layer comprises:

forming a trench in the semiconductor substrate;

covering the substrate having the trench formed therein with an insulating material; and etching back the insulating material to leave the insulating material in the trench, using a surface of the semiconductor substrate as an etch-stop surface.

3. The method according to claim 1, wherein the insulating interlayer is silicon oxide.

4. The method according to claim 2, wherein the insulating layer is silicon oxide.

5. The method according to claim 1, wherein the barrier layer is a nitride layer.

6. The method according to claim 1, comprising forming the trench in the semiconductor substrate by etching the semiconductor substrate using a trench etch mask.

7. The method according to claim 6, wherein the barrier layer etch mask is a photoresist pattern, the barrier layer etch mask and the trench etch mask being inverse to each other.

8. The method according to claim 1, comprising, after forming a contact hole:

forming a conductive plug in the contact hole; and forming a conductive line over the insulating interlayer and in electrical contact with the conductive plug.

9. The method according to claim 1, comprising forming a salicide layer over the impurity diffusion region.

10. The method according to claim 1, wherein the impurity diffusion region is lightly doped compared to a source/drain region of the transistor.

* * * * *